United States Patent [19]

Matsunaga

[11] Patent Number: 5,087,832
[45] Date of Patent: Feb. 11, 1992

[54] BALANCED SIGNAL RECEIVING CIRCUIT

[75] Inventor: Hiroshi Matsunaga, Yokohama, Japan

[73] Assignee: Fujitsu Limited, Kawasaki, Japan

[21] Appl. No.: 584,737

[22] Filed: Sep. 19, 1990

[30] Foreign Application Priority Data

Sep. 19, 1989 [JP] Japan .................................. 01-240689

[51] Int. Cl.⁵ .............................................. H03K 5/22
[52] U.S. Cl. .................................. 307/350; 307/355; 307/234
[58] Field of Search ............... 307/350, 351, 352, 353, 307/354, 355, 358, 360, 362, 234, 530, 357

[56] References Cited

U.S. PATENT DOCUMENTS 4,225,795  9/1980  Keeney ........................... 307/355 X
4,945,261  7/1990  Wright ............................. 307/350 X Primary Examiner—Eugene R. LaRoche
Assistant Examiner—Ali Neyzari
Attorney, Agent, or Firm—Staas & Halsey

[57] ABSTRACT

A receiving circuit includes of a differential amplifier which receives at an input stage a balanced signal transmitted from a pair of signal transmission lines and outputs a logic "H" or "L". An alarm generating unit which includes positively and negatively biased first and second differential amplifiers, a logic gate unit and a pulse width detection unit. The logic gate unit is located at the input stage of the differential amplifier and displays the detection of a small differential voltage appearing at the time abnormalities are detected. The pulse width detection unit produces an alarm signal when the pulse width of the output pulse from the logic gate unit has become longer than a predetermined pulse width. By using the first and second differential amplifiers, it is possible to prevent the signal transmission lines from becoming sources of electromagnetic interference (EMI).

12 Claims, 15 Drawing Sheets

INPUT-OUTPUT
CHARACTERISTIC

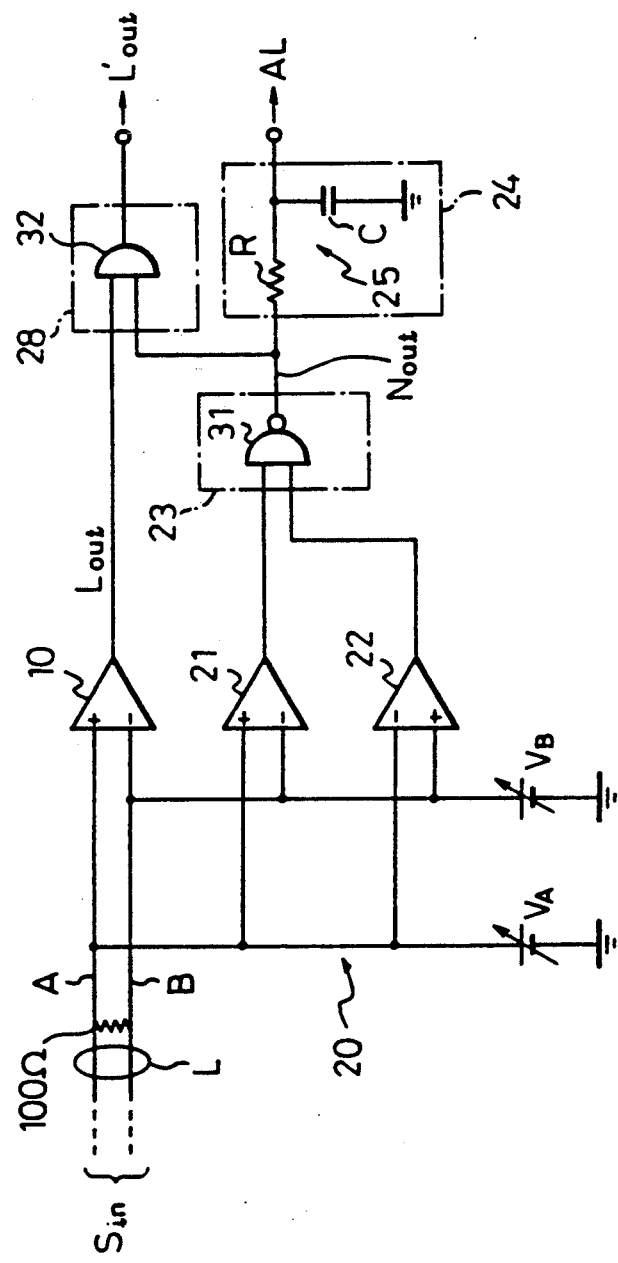

BALANCED SIGNAL RECEIVING CIRCUIT

BACKGROUND OF THE INVENTION

1. Field of the Invention

The present invention balanced signal receiving circuit provided with a differential amplifier which receives a transmitted balanced signal as an input. The signal receiving circuit has a step type input-output characteristic such that the logic of the output inverts when the input voltage crosses the zero volt level. An alarm generating means issues an alarm signal when the transmission of the balanced signal is stopped.

Discussion will be made of a balancing transmission system having a balanced signal transmitting circuit which transmits the balanced signal and a balanced signal receiving circuit which receives the balanced signal through a paired line.

In this system, when the balanced signal transmitting circuit and the balanced signal receiving circuit are installed far apart from each other, generally a special signal line for immediately notifying the receiving circuits of abnormalities occurring at the transmitting circuit side is not necessary. The "abnormalities" spoken of include stopping the transmission of the balanced signal, for example, due to a transmission side power down at the transmitting circuit side or disconnection of the paired line connector at the transmitting circuit side. Therefore, in the above-mentioned balanced signal receiving circuit, it is necessary to provide an alarm generating means for issuing an alarm signal when the transmission of the balanced signal stops.

2. Description of the Related Art

Normally, a terminating resistor is provided at the input of the above differential amplifier. This terminating resistor has a very low resistance value, so when the above-mentioned abnormality occurs, the input of the differential amplifier short-circuits. This results in the output level of the balanced signal receiving circuit becoming indefinite. Therefore, the alarm signal can no longer be generated.

To eliminate this problem, a pull-up resistor and a pull-down resistor are connected in series with the terminating resistor at the input of the differential amplifier. The pull-up resistor and pull-down resistor stabilize the output level of the balanced signal receiving circuit and enable reliable generation of the alarm signal by the stabilized output level.

If use is made of an alarm generating means including the pull-up resistor and the pull-down resistor, a deleterious electromagnetic wave is radiated from a transmission line (paired line) of the balanced signal, which works as a source of electromagnetic interference (EMI). Note that the above prior art and problems therewith will be explained in more detail later with reference to the drawings.

SUMMARY OF THE INVENTION

An object of the present invention is to provide a balanced signal receiving circuit which can detect stoppage of the balanced signal without causing electromagnetic interference by fundamentally eliminating the unbalance, components of the balanced signal flowing by connecting a low resistance resistor to the balanced input.

To achieve the above object, the alarm generating means of the present invention is constructed of a small differential voltage detecting means consisting of a first differential amplifier having slightly negatively biased input-output characteristics and a second differential amplifier having slightly positively biased input-output characteristics. The small differential voltage detecting means is connected in parallel with respect to the input of the above-mentioned differential amplifiers. A logic gate means receives the outputs of the first and second small differential voltage detecting means as an input and displays the occurence of a small differential voltage at the inputs of the differential amplifier. A pulse width detecting means outputs alarm signals when a pulse width of an output pulse from the logic gate means exceeds a predetermined threshold value.

BRIEF DESCRIPTION OF THE DRAWINGS

The above object and features of the present invention will be more apparent from the following description of the preferred embodiments with reference to the accompanying drawings, wherein:

FIG. 13 is a circuit diagram of a second embodiment based on the first modified principle of FIG. 10;

FIG. 15A to FIG. 15E are waveforms diagrams of signals at key portions of FIG. 13;

DESCRIPTION OF THE PREFERRED EMBODIMENTS

Before describing the embodiments of the present invention, the related art and disadvantages therein will be described with reference to the related figures.

Figure 1:
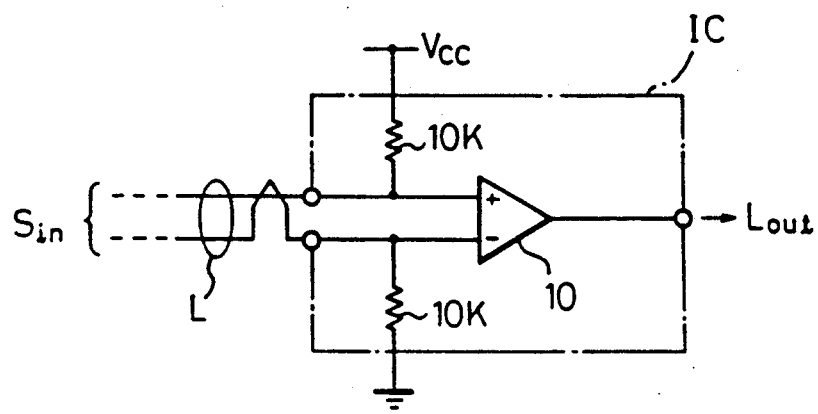
FIG. 1 is a circuit diagram of key portions of a balanced signal receiving circuit.

FIG. 1 is a circuit diagram of the general construction of key portions of a balanced signal receiving circuit.

When transmission of the balanced signal stops due to transmission side power down or disconnection of a paired line connector on the transmitting circuit side, it is necessary to fix the output potential (logic) of the balanced signal receiving circuit (hereinafter referred to also merely as a "receiving circuit"). This is because unless the output potential (logic) is fixed as either "H" (high) or "L" (low), it is not possible to handle such abnormalities. Further, to deal with such abnormalities, it is necessary to provide some sort of alarm generating means and to transmit an alarm signal.

To fix the above-mentioned output voltage, in general a high impedance means is introduced as in FIG. 1. In FIG. 1, 10 is a differential amplifier (operational amplifier)forming a main part of the balanced signal receiving circuit. To the input of the differential amplifier 10 is applied an offset voltage having a high impedance (in this example, a 10KΩ resistance). Note that in the FIG. 1, the example has a differential amplifier 10 and resistor (10K) formed in an IC. At the input of the IC a paired line L (line indicated by crossed symbol) is connected, a balanced signal $S_{in}$ is received, and an output $L_{out}$ is transmitted.

However, the above technique is not practical. The reason why is that usually a terminating resistor is connected for obtaining matching with the paired line L at the front stage of the receiving circuit.

Figure 2:
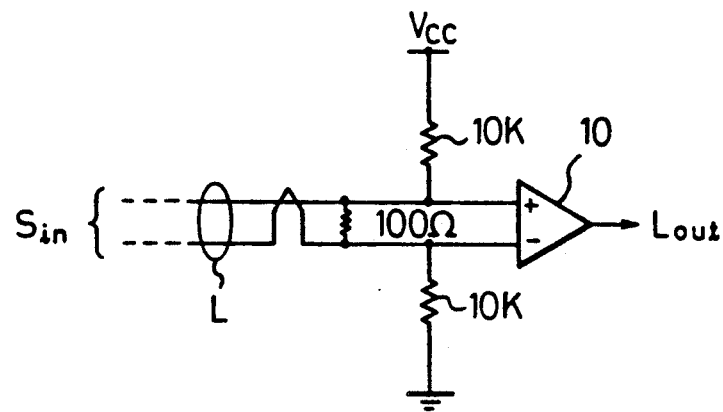
FIG. 2 is a circuit diagram actually used balanced signal receiving circuit.

FIG. 2 is a view of an actually used balanced signal receiving circuit. The difference with FIG. 1 is that provision is made of the above terminating resistor at the front stage of the differential amplifier 10. In practice, it is usual to use such a terminating resistor. Note that 100Ω as the terminating resistor.

There is a problem with the receiving circuit shown in FIG. 2 however. The problem is that since the resistance value of the terminating resistor is an extremely low 100Ω, when the above abnormality occurs (transmission side power down or disconnection of paired line connector), the input of the differential amplifier 10 becomes a so-called shorted state and the level of the output $L_{out}$ becomes indefinite.

To eliminate this problem, the following receiving circuit has been proposed.

Figure 3:
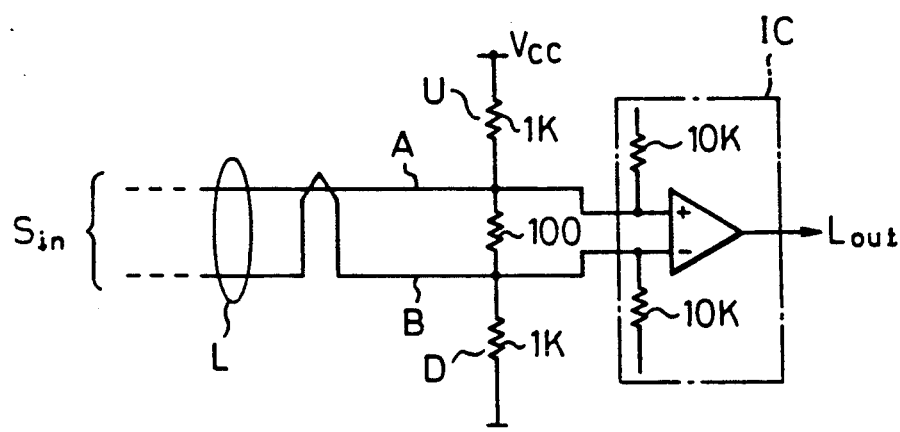
FIG. 3 is a circuit diagram of a circuit which eliminating the problem caused by the circuit of FIG. 2.

FIG. 3 is a circuit for eliminating the problem caused by the circuit of FIG. 2. The difference between the receiving circuit of FIG. 3 and the receiving circuit of FIG. 2 is that the input of the differential amplifier 10 has a pair of 1KΩ (pull-up resistor U and pull-down resistor D) resistors with a value lower than 10KΩ connected in series. Note that in FIG. 3, the receiving circuit is shown as an IC in the same way as FIG. 1.

FIG. 3 has a bias forcibly applied to the input of the receiving circuit by employing voltage division by using the above-mentioned resistors, whereby the problem of indefiniteness of the level of the output $L_{out}$ is eliminated.

The three resistors (1KΩ, 100Ω, and 1KΩ) of the receiving circuit at the input stage shown in FIG. 3 form the alarm generating means for indicating the abnormal state. When an abnormality occurs, the alarm generating means works so that the output $L_{out}$ is fixed stably to the "H" or "L" level. This fixed output $L_{out}$ becomes the alarm signal output from the alarm generating means.

The receiving circuit of FIG. 3 is therefore provided with an alarm generating means sufficient for practical use. Since, however, the alarm generating means is made by sandwiching the 100Ω resistor with lower resistance value resistors of 1KΩ at the balanced input of the receiving circuit, the following problem occurs.

Figure 4:
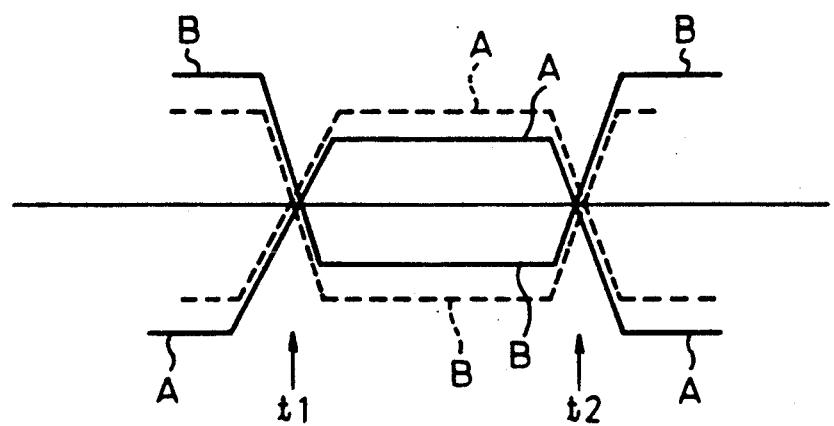
FIG. 4 is a timing diagram for explaining the problems caused by receiving circuit of FIG. 3.

FIG. 4 is a diagram for explaining the problem caused by the receiving circuit of FIG. 3. In the figure, the waveform indicated by the dotted line is an ideal balancing waveform. Note that the waveforms A and B show part of the balanced signal appearing at the line A and the line B in FIG. 3. The ideal balancing waveform loses its balance and becomes an unbalanced waveform due to the low resistance value resistors at the balanced input of the receiving circuit. This is because the pull-up resistor U of FIG. 3 causes the signal level of the line A to shift downward and conversely the pull-down resistor D (1KΩ) causes the signal level of the line B to shift upward.

When transmitting such an unbalanced signal, a deleterious electromagnetic wave is radiated each time the level switches (t1, t2, ... ), causing EMI, which is now considered a problem in the West and Japan, as mentioned earlier.

Figure 5:
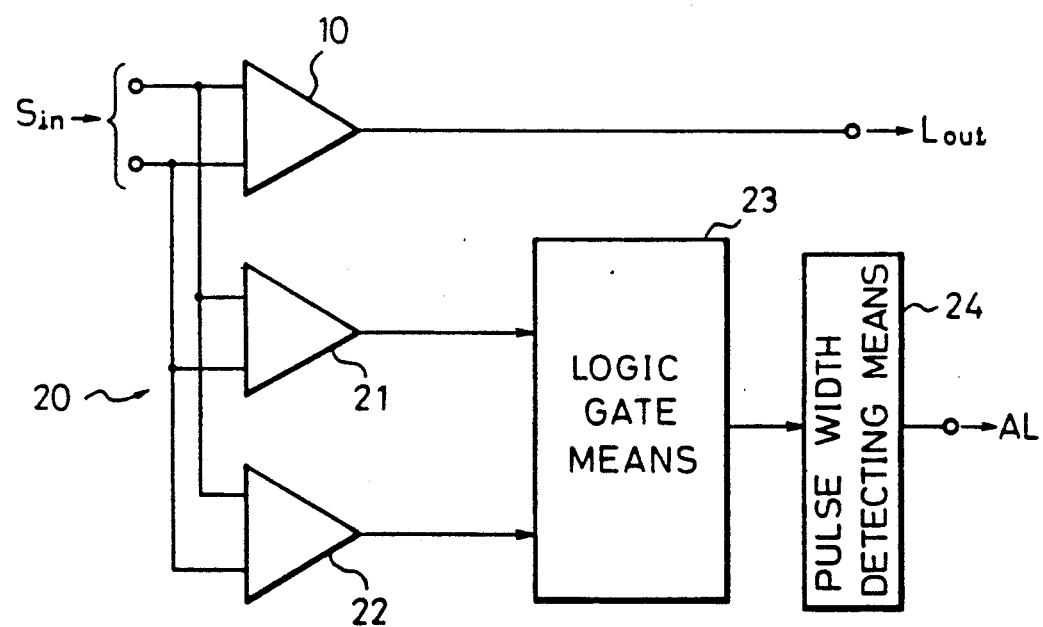
FIG. 5 is a block diagram of the present invention.

FIG. 5 is a block diagram of the present invention. In FIG. 3, 10 is the previously mentioned differential amplifier, which transmits an output $L_{out}$ corresponding to the balanced signal $S_{in}$. Reference numeral 20 is a small differential voltage detecting means, which includes two differential amplifiers. That is, 21 is a first differential amplifier and 22 is a second differential amplifier, which, together with the differential amplifier 10, receive as an input the balanced signal $S_{in}$. Reference numeral 23 is a logic gate means, which receives as an input the outputs of the first and second differential amplifiers 21 and 22 and outputs a small differential voltage detection display signal showing that a small differential voltage has occurred at the input of the differential amplifier 10. Reference numeral 24 is a pulse width detecting means, which outputs an alarm signal AL when the pulse width of the output pulse from the logic gate means 23 exceeds a predetermined threshold value. Here, the small differential voltage detecting means 20 includes a first differential amplifier 21 having a slightly negatively biased input-output characteristic and a second differential amplifier 22 having a slightly positively biased input-output characteristic. The first and second differential amplifiers 21 and 22 are connected in parallel with respect to the input of the differential amplifier 10. Note that the input-output characteristic of the differential amplifier 10 is step-like in form, with the logic of the output $L_{out}$ inverting when the input-output voltage of the balanced signal $S_{in}$ passes zero volts.

The logic gate means 23 is biased at zero volts and its environs. When inside the bias range, it outputs the small differential voltage detection display signal.

Figure 6:
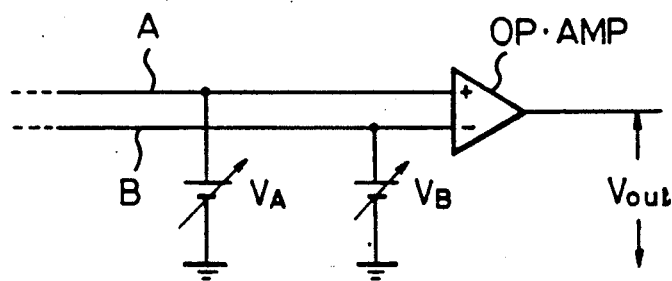
FIG. 6 is circuit diagram of a differential amplifier drawn for explaining the operation of the present invention.

FIG. 6 is a circuit diagram of a differential amplifier explaining the operation of the present invention and corresponds to the differential amplifiers (operational amplifiers) of FIG. 5. FIG. 6 shows that the input bias voltage of the differential amplifiers can be variably determined. This in itself, however, is well known for operational amplifiers. Specifically, by suitably selecting the constants of the internal elements making up the operational amplifiers, it is possible to set any input bias voltage. This is shown by the variable voltage DC power sources ($V_A$ and $V_B$). By setting the input bias voltage in this way, it is possible to change the input-output characteristic of the differential amplifiers (operational amplifiers) in any way.

Figure 7:
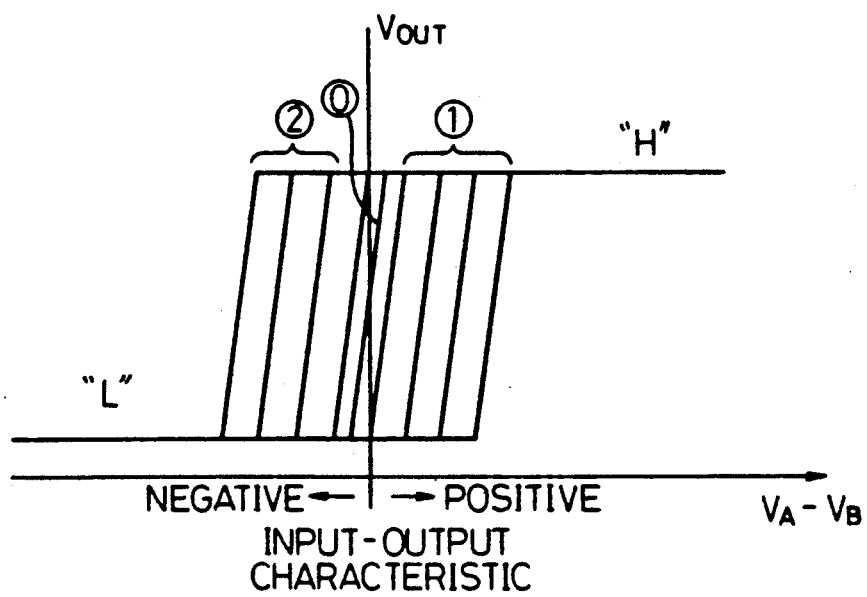
FIG. 7 is a graph of the input-output characteristics of an operational amplifier of FIG. 6.

FIG. 7 is a graph of the input-output characteristic of an operational amplifier of FIG. 6. In particular, it shows the input-output characteristic when the input bias voltage ($V_A - V_B$) is changed. $V_{out}$ is the output potential (output logic) of the operational amplifier. As shown by the graph, in accordance with the positive ($V_A > V_B$) or negative ($V_A < V_B$) value of $V_A - V_B$, the input-output characteristic of ① and the input-output characteristic of ② are obtained. When $V_A = V_B$, the input-output characteristic of ⓪ shown. This input-output characteristic ⓪ is the step-like input-output characteristic where the logic of the output ($V_{out}$) inverts ("L"→"H" or "H"→"L") when the input output voltage crosses zero volts. Therefore, the input-output characteristic ⓪ is the input-output characteristic of the previously mentioned differential amplifier 10, that is the input-output characteristic of a typical operational amplifier.

As opposed to this, the first input-output characteristic ① is a negatively biased input-output characteristic ⓪. This first input-output characteristic is input to the first differential amplifier 21. Conversely, the second input-output characteristic ② is a positively biased input-output characteristic ⓪. This second input-output characteristic is input to the second differential amplifier 22.

Figure 8:
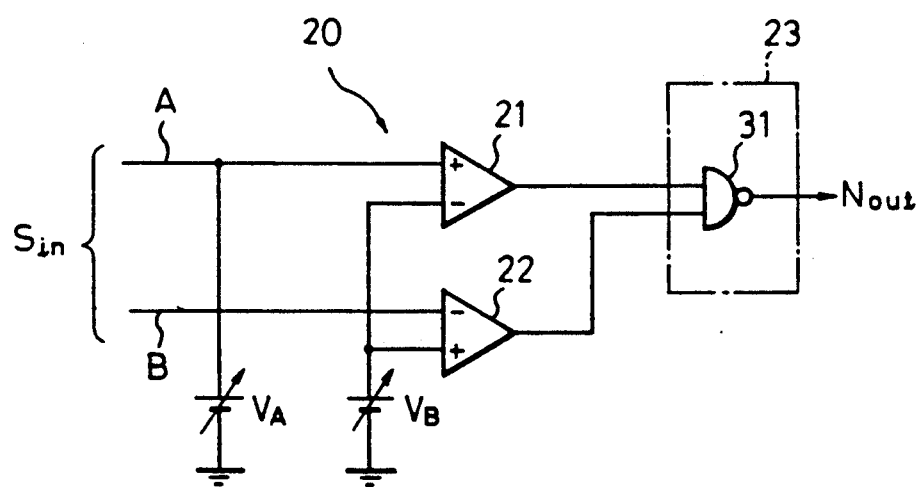
FIG. 8 is a circuit diagram of a small differential voltage detecting means 20 and logic gate means 23 in FIG. 5.

FIG. 8 is a circuit diagram for explaining in further detail a small differential voltage detecting means 20 and logic gate means 23 in FIG. 5. Two of the operational amplifiers shown in FIG. 6 are connected in parallel in FIG. 8. The outputs are input to the logic gate means 23. Note that for easy understanding in FIG. 8 the logic gate means 23 is shown as, for example, of a NAND gate 31.

Figure 9A:
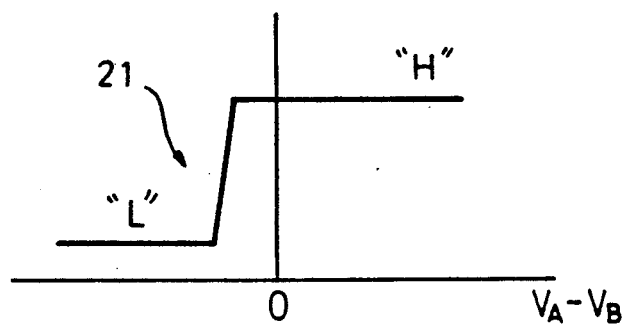
FIG. 9A to FIG. 9C are signal level diagrams used for explaining the operation of the circuit of FIG. 8.
Figure 9B:
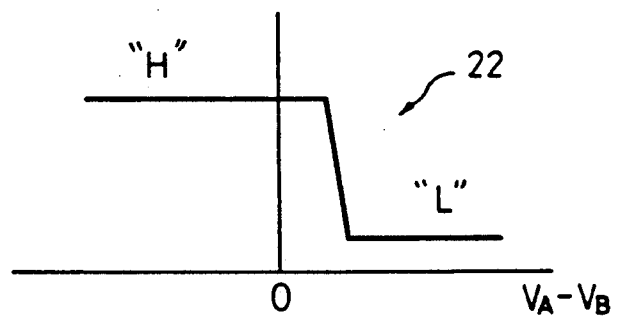
Figure 9C:
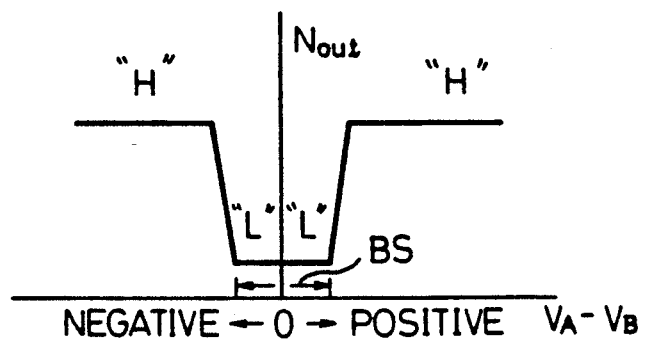

FIG. 9A to FIG. 9C are signal level diagrams used for explaining the operation of the circuit of FIG. 8. FIG. 9A shows the input-output characteristic of the first differential amplifier 21 and corresponds to the first input-output characteristic (② in FIG. 7). FIG. 9B shows the input-output characteristic of the second differential amplifier 22 and corresponds to the second input-output characteristic (inverted ⓪ of FIG. 7). Therefore, if a common input voltage is applied to the first and second differential amplifiers 21 and 22 having these first and second input-output characteristics and these outputs are applied to the NAND gate 31, the output $N_{out}$ becomes as shown in FIG. 9C. That is, when the input voltage is in the bias range biased at zero voltage and its neighboring voltage, $N_{out}$ becomes "L". A signal showing that a small differential voltage has appeared at the input of the differential amplifier 10, that is, a small differential voltage detection display signal, is formed. On the other hand, when the input voltage is outside the above bias range, a small differential voltage does not appear at the input of the differential amplifier 10 and, at both polarities of the input voltage, $N_{out}$ becomes "H". The point to particularly note in FIG. 9A to FIG. 9C is the production of the bias range BS. Abnormalities are detected using $N_{out}$="L" as shown here. More specifically, the balanced signal receiving circuit of the present invention eliminates the pull-up resistor U and pull-down resistor D of FIG. 3 (the causes of the generation of EMI), but a 100Ω terminating resistor still is present at the input stage of the receiving circuit. If an abnormality occurs in this state, the input of the receiving circuit will be shorted due to the low resistance terminating resistor and the input voltage will become equivalent to about zero voltage.

This approximately zero volt appears as "L", that is, the small differential voltage detection display signal, at the output ($N_{out}$) of the NAND gate 31 (see FIG. 9C). In the end, when an abnormality occurs, an output fixed as "L" is obtained and, using this, the alarm signal is generated. The width of the "L" signal (that is, the bias range BS of FIG. 9C) is necessary to prevent the logic of $N_{out}$ not being fixed as "L" stably due to noise (normally smaller than 0.5V) given via the paired line L in the shorted state. For example, the bias range BS is the width 1V (+0.5V and −0.5V around zero volts).

Therefore, by the adoption of the bias range BS, a fixed logic "L", that is, a small differential voltage detection display signal, is obtained during the above abnormalities. This signal is used for obtaining a stabilized alarm signal.

Examining this alarm signal in more detail, the input voltage becomes zero volts when the level of the balanced signal $S_{in}$ switches (t1 and t2 in FIG. 4). Therefore, around t1 or t2, the output $N_{out}$ of the NAND gate 31 of FIG. 8 becomes "L". However, $N_{out}$="L" in this case differs from the $N_{out}$="L" during abnormal times, so it is necessary to differentiate the two. $N_{out}$="L" at the time of usual operation occurs instantaneously at the above-mentioned t1 and t2, while the $N_{out}$="L" at the time of abnormality is continuously generated. Taking note of this, it will be understood that it is enough to generate the true alarm signal AL when the pulse width of the output pulse ($N_{out}$) from the logic gate means 23 passes a predetermined threshold value. For this purpose, a pulse width detection means 24 is provided.

Figure 10:
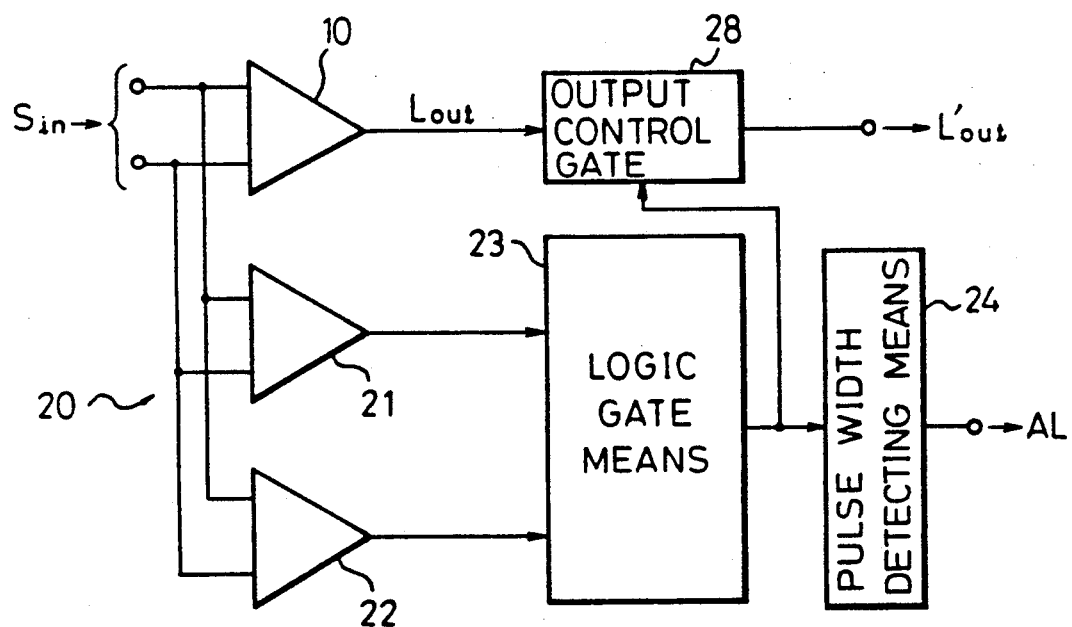
FIG. 10 is a block diagram of a first example of a partial modification of the present invention.

FIG. 10 is a block diagram of a first example of a partial modification of the principle of the present invention. In the circuit of FIG. 10, an output control gate 28 is further introduced. This output control gate 28 closes upon the small differential voltage detection display signal from the logic gate means 23 to shut out the output $L_{out}$ from the differential amplifier 10. Therefore, the output $L'_{out}$ obtained through the output control gate 28 is slightly different from $L_{out}$.

The advantages of the circuit of FIG. 10 are that, first, the noise appearing in the above-mentioned bias range BS does not affect stages following the balanced signal receiving circuit and, second, when the above-mentioned abnormality occurs, the output $L_{out}$ of the differential amplifier 10 can be blocked faster than the generation of the alarm signal AL. This is because the alarm signal AL is not output from the means 24 unless a certain amount of time has passed from the output of the display signal from the logic gate means 23.

Figure 11:
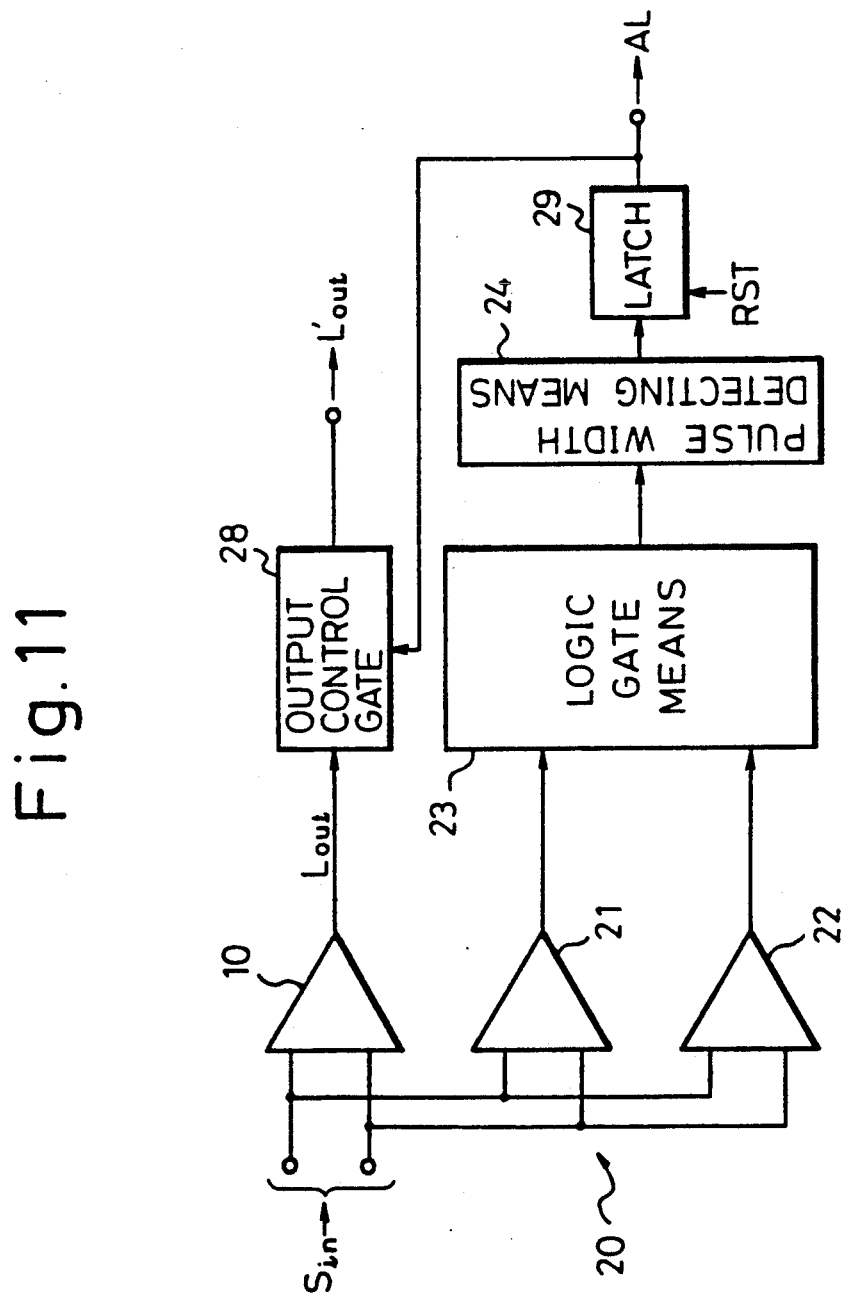
FIG. 11 is a block diagram of a second example of a partial modification of the present invention.

FIG. 11 is a block diagram of a second example of a partial modification of the principle of the present invention. The difference from the circuit of FIG. 10 is that a latch means 29 is introduced and the output control gate 28 is closed by the alarm signal AL from the latch means 29. The advantage of the circuit of FIG. 11 is that once the alarm signal AL is generated, unless an outside operator gives a reset signal RST, there will not be any leakage of output of the balanced signal receiving circuit, during times of abnormality, to the following circuits.

Figure 12:
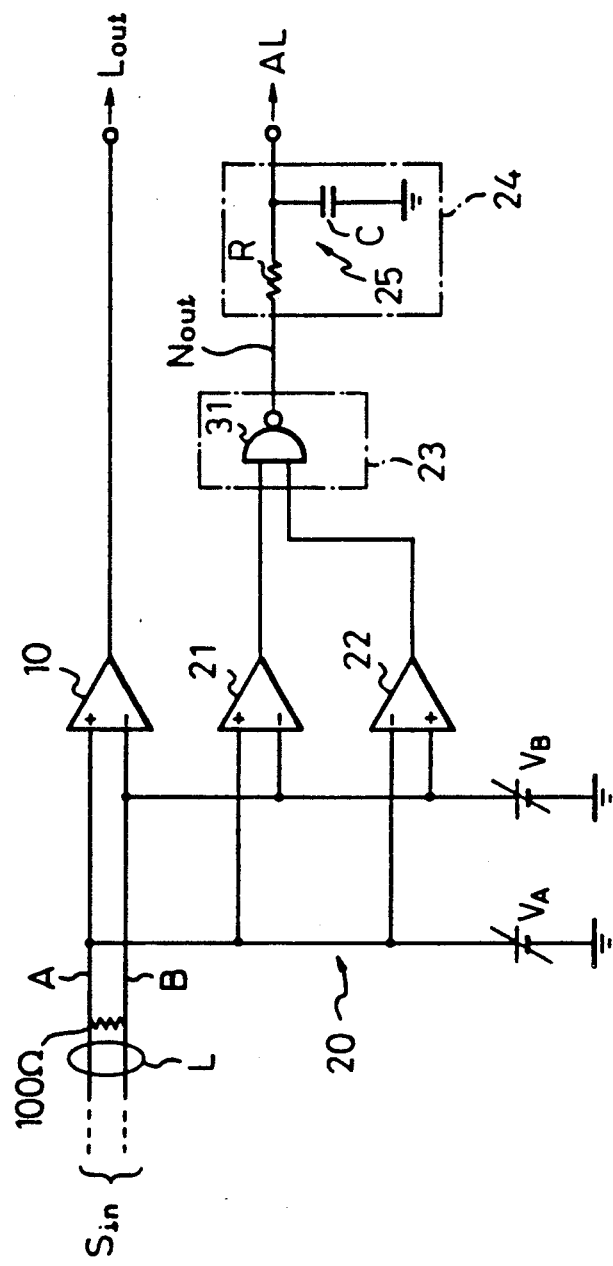
FIG. 12 is a circuit diagram of a first embodiment of the present invention based on of FIG. 5.

FIG. 12 is a circuit diagram of a first embodiment based on the principle of FIG. 5. In FIG. 12, constituent elements similar to those of FIG. 5 are given the same reference numerals or symbols. Note that $V_A$ and $V_B$ of the input stage of the differential amplifier are the variable bias voltages as shown in FIG. 6.

The variable bias voltages $V_A$ and $V_B$ are applied respectively to the noninverting input (+) and inverting input (−) of the operational amplifier forming the differential amplifier 10. This is the same as with the operational amplifier forming the first differential amplifier 21. However, the operating amplifier forming the first differential amplifier 21 receives $V_B$ and $V_A$ with the noninverting input (+) and the inverting input (−).

The outputs of the first and second differential amplifiers 21 and 22 are applied to the inputs of the NAND gate 31. The output of the NAND gate 31 is applied to the pulse width detecting means 24. When the output $N_{out}$ of the NAND gate 31 is at the "L" level for more than a certain period of time, the alarm signal AL is output from the detecting means 24. In this embodiment, the pulse width detecting means 24 is realized by the CR integration circuit 25. The output of the CR integration circuit 25 is usually "H", but when the above abnormality occurs, it continues to fall toward "L" during a time constant of the CR integration circuit 25. When the output completely reaches the "L" level, is deemed as the alarm signal AL.

FIG. 13 is a circuit diagram of the second embodiment based on the first modified principle of FIG. 10. In the figure, the output control gate 28 is formed by an AND gate 32. The output of the NAND gate 31 and the output of the differential amplifier 10 are input to the AND gate 32. The output $L'_{out}$ of the AND gate 32 is the inherent output logic. The logical operation for obtaining $L'_{out}$ the output $L_{out}$ is controlled by the output of the NAND gate 31. During abnormalities, the NAND gate 31 outputs "L". This "L" becomes the alarm signal AL (at normal times "H"). In addition it is applied to one of the inputs of the AND gate 32 and closes the same. Therefore, the output $L_{out}$ from the differential amplifier 10 is blocked. That is, the output $L'_{out}$ from the AND gate 32 is the output obtained by passing $L_{out}$ as it is when the input voltage is outside of the bias range BS and is the output obtained by blocking $L_{out}$ when it is in the bias range BS. Blocking $L_{out}$ when it is inside the bias range BS has the effect of not allowing noise to affect circuits after the receiving circuit, as mentioned earlier. Therefore, $L'_{out}$ differs somewhat from $L_{out}$, as shown in FIG. 14D. Further, there is the effect of immediately blocking the output of the differential amplifier 10 upon abnormalities arising, as mentioned before.

Figure 14A:
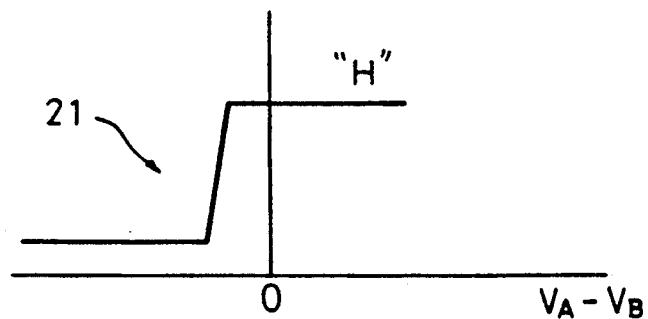
FIG. 14A to FIG. 14D are signal level diagrams of the signal levels appearing at key portions of FIG. 13.
Figure 14B:
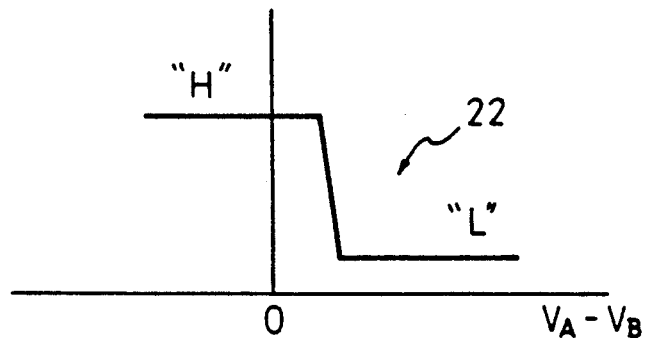
Figure 14C:
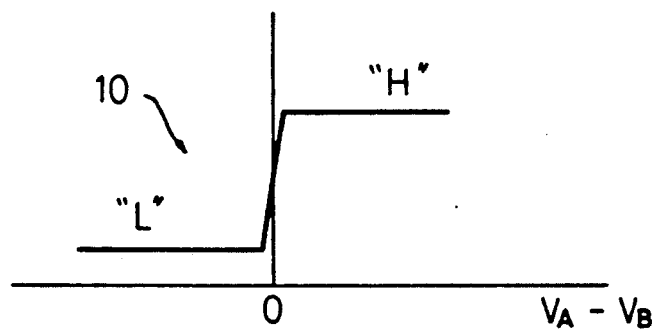
Figure 14D:
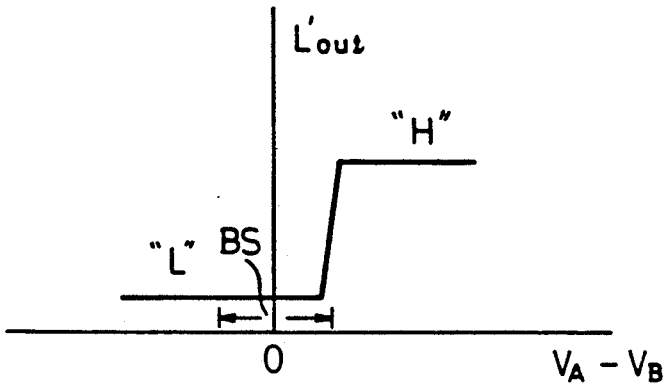

FIG. 14A to FIG. 14D are signal level diagrams of the signal levels appearing at key portions of FIG. 13. FIG. 14A and FIG. 14B, like FIG. 9A and FIG. 9B, show the input-output characteristics of the first and second differential amplifiers 21 and 22. FIG. 14C shows the input-output characteristic of the differential amplifier 10. The output $L'_{out}$ obtained by passing the outputs of the differential amplifiers 10, under control of the NAND gate 31 and the AND gate 32 differs somewhat from the original $L_{out}$ (equal to FIG. 14C) as shown in FIG. 14D, but there is no problem with using it as a logic circuit. Rather, it has the advantage of preventing indefiniteness of the output due to noise when the input voltage is near zero volts.

Figures 15A, 15B, 15C, 15D:
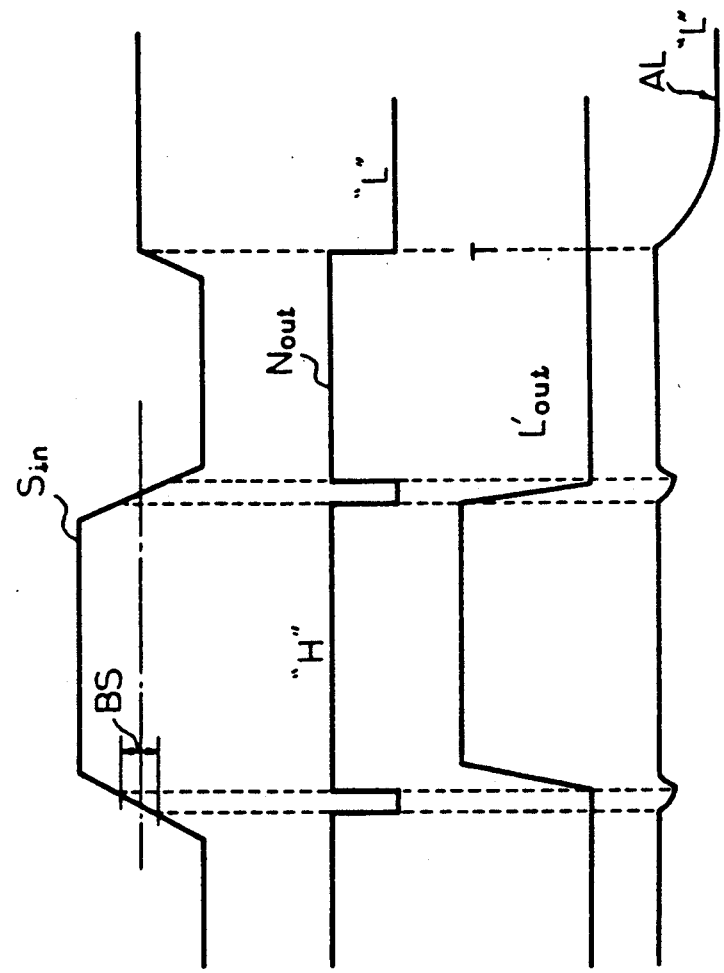

FIG. 15A to FIG. 15E are waveforms diagrams of signals at key portions of FIG. 13. FIG. 15A is an input signal of the differential amplifier 10 and shows by the dot-dash line the level where the input voltage is approximately zero volts. The above-mentioned bias range is shown as BS.

FIG. 15B shows the output pulse waveform of the NAND gate 31 which changes to "L" in BS.

FIG. 15C shows the output of the AND gate 32, i.e., the waveform of the output $L'_{out}$.

FIG. 15D shows the output waveform of the CR integration circuit 25. When an abnormality occurs the output falls from "H" to "L". When it reaches "L", it becomes the alarm signal AL. The output of the CR integration circuit 25 falls from "H" to "L" each time the bias range BS is passed, but normally it never completely reaches "L" and the alarm signal AL is not generated.

Figure 16:
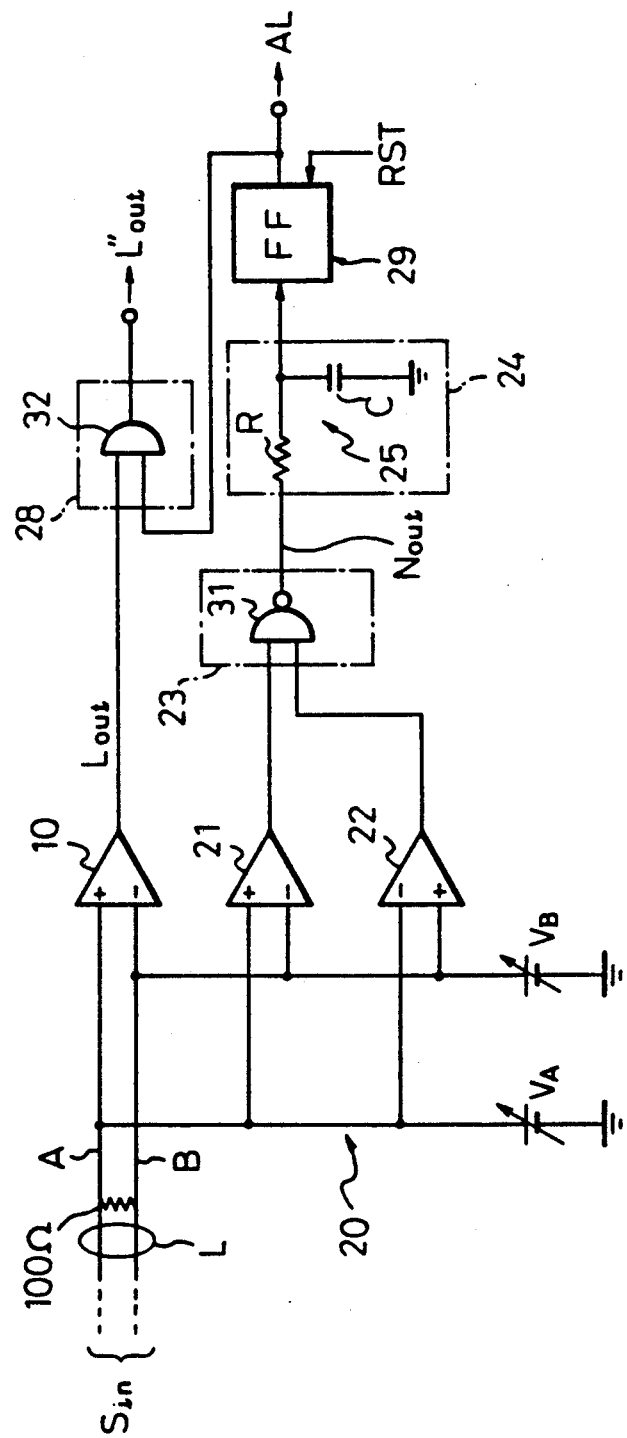
FIG. 16 is a circuit diagram of a third embodiment based on the second modified principle of FIG. 11.

FIG. 16 is a circuit diagram of a third embodiment based on the second modified principle of FIG. 11. The latch means 29 is realized by a flip-flop FF.

Figure 17:
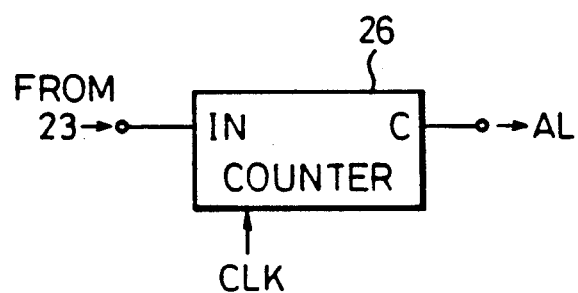
FIG. 17 is a block diagram of a pulse width detection means 24.

FIG. 17 is a view of another example of a pulse width detection means 24, which uses a counter 26. The counter 26 counts the clocks CLK while the small differential voltage detection display signal is being output from the logic gate means 23. When an overflow signal is output from the carry output C, the outputs from the counter is the alarm signal. The counting time of the counter 26 corresponds to the time constant of the CR integration circuit 25. Note that the counter 26 is cleared if a signal is not input to the input IN. The counter 26 may be, for example, an up counter or a down counter.

Figure 18:
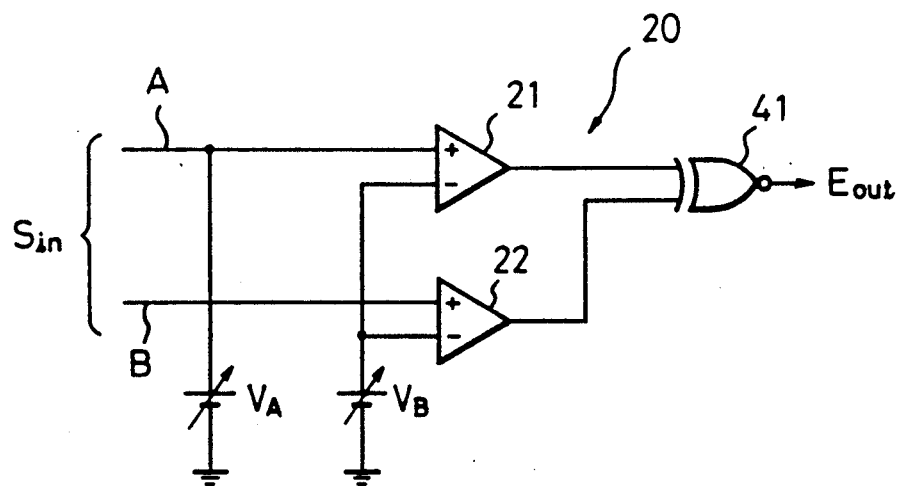
FIG. 18 is a circuit diagram of another example of the small differential voltage detecting means 20 and logic gate means 23 of FIG. 5.

FIG. 18 is a circuit diagram of another example of the small differential voltage detecting means 20 and logic gate means 23 of FIG. 5 and corresponds to the above-mentioned FIG. 8. In FIG. 18, the inverting input and the noninverting input of the second differential amplifier 22 of FIG. 8 are switched. That is, the input-output characteristic of the second differential amplifier 22 becomes as shown in FIG. 19B.

Figure 19A:
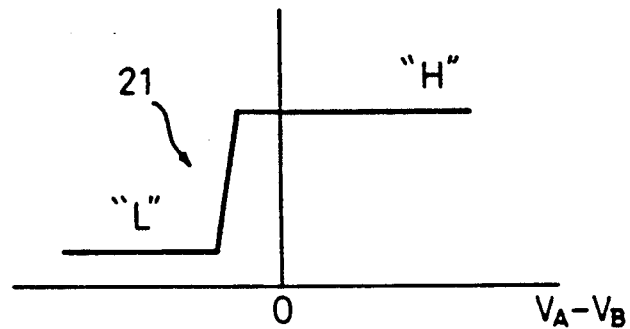
FIG. 19A to FIG. 19C are signal level diagrams of the operation of the circuit of FIG. 18.
Figure 19B:
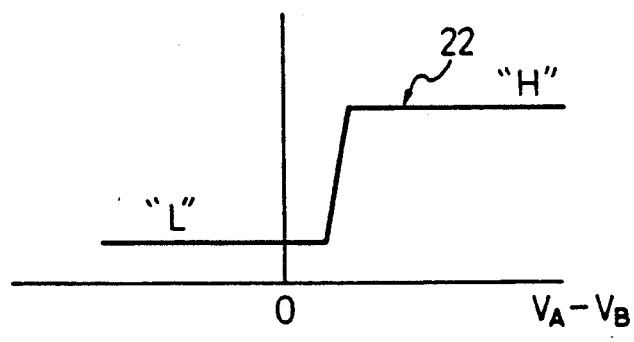
Figure 19C:
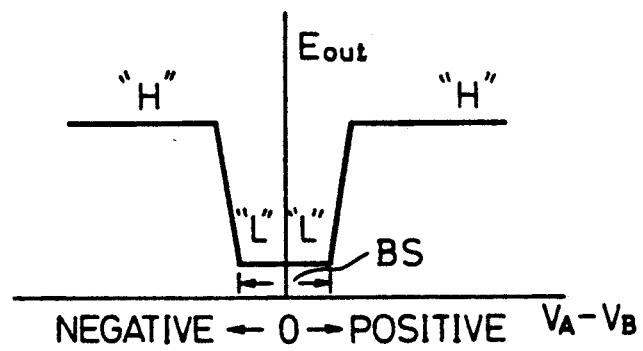

FIG. 19A to FIG. 19C are signal level diagrams showing the operation of the circuit of FIG. 18 and correspond to FIG. 9A to FIG. 9C. The NAND gate 31 of FIG. 8 is replaced with the EXNOR gate 41. This being so, the output $E_{out}$ of the EXNOR gate 41 becomes as shown in FIG. 19C and shows exactly the same input-output characteristic as the output $N_{out}$ of the NAND gate 31.

As explained above, according to the present invention, it is possible to fundamentally eliminate the occurrence of noise (electromagnetic waves) caused by unbalancing components of balanced signals and to obtain a stable logic "L" from the logic gate means, so it is possible to reliably deal handle any abnormalities in the circuit.

What is claimed is:

1. A balanced signal receiving circuit which receives a transmitted balanced signal as an input, comprising:
   a differential amplifier having a step-like input-output characteristic where the logic of the output inverts when an input voltage crosses zero volts;
   alarm generating means which issues an alarm signal when the transmission of the balanced signal has been blocked, said alarm generating means comprising:
   small differential voltage detecting means including:
      a first differential amplifier having a negatively biased input-output characteristic; and
      a second differential amplifier having a positively biased input-output characteristic, the inputs of said first and second differential amplifiers being connected in parallel with respect to an input of said differential amplifier which detects the small differential voltage at the input;

logic gate means which receives the outputs of said first and second differential amplifiers and outputs a small differential voltage detection display signal showing that a small differential voltage has been detected when it appears; and pulse width detecting means which outputs an alarm signal when the pulse width of the output pulse from said logic gate means exceeds a predetermined threshold value.

2. A balanced signal receiving circuit as set forth in claim 1, further comprising an output control gate connected to said differential amplifier and said logic gate means, said output control gate opening and closing in accordance with the logical level of the output pulse from said logic gate means.

3. A balanced signal receiving circuit as set forth in claim 1, further comprising:
an output control gate operatively connected to said differential amplifier;
latch means for receiving an output from said pulse width detecting means and generating the alarm signal, said output control gate receiving said alarm signal from said latch means.

4. A balanced signal receiving circuit as set forth in claim 1, wherein said logic gate means comprises a two input AND gate means which receives the outputs of said first and second differential amplifiers, a non-inverting input of said first differential amplifier and an inverting input of said second differential amplifier being connected to a first one of a pair of signal transmission lines on which said balanced signal is transmitted, an inverting input of said first differential amplifier and a non-inverting input of said second differential amplifier being connected to a second one of said pair of signal transmission lines.

5. A balanced signal receiving circuit as set forth in claim 1, wherein said logic gate means comprises a two input Exclusive OR gate means which receives the outputs of said first and second differential amplifiers, non-inverting inputs and inverting inputs of said first differential amplifier and said second differential amplifier being respectively connected to a pair of signal transmission lines on which said balanced signal is transmitted.

6. A balanced signal receiving circuit as set forth in claim 1, wherein said pulse width detecting means comprises a CR integration circuit receiving an output pulse from said logic gate means.

7. A balanced signal receiving circuit as set forth in claim 1, wherein said pulse width detecting means comprises a counter which begins a counting operation upon receiving an output pulse from said logic gate means and issues said alarm signal when said counter has finished counting a predetermined count.

8. A balanced signal receiving circuit as set forth in claim 2, wherein said output control gate comprises a two input AND gate which receives outputs from said differential amplifier and said logic gate means.

9. A balanced signal receiving circuit as set forth in claim 3, wherein said output control gate comprises a two input AND gate which receives the outputs from said differential amplifier and said latch means.

10. A balanced signal receiving circuit as set forth in claim 9, where said latch means comprises a flip-flop.

11. A balance signal receiving circuit which receives a transmitted balanced signal as an input, comprising:
a differential amplifier having a step-like input-output characteristic where the logic of the output inverts when an input voltage crosses a zero volt level;
alarm generating means which issues an alarm signal when the transmission of the balanced signal has been blocked, said alarm generating means comprising:
small differential voltage detecting means including:
a first differential amplifier having a negatively biased input-output characteristic; and
a second differential amplifier having a positively biased input-output characteristic, the inputs of said first and second differential amplifiers being connected in parallel with respect to an input of said differential amplifier which detects the small differential voltage at the input;
logic gate means which receives the outputs of said first and second differential amplifiers and outputs a small differential voltage detection display signal showing that a small differential voltage has been detected when it appears; and
pulse width detecting means which outputs an alarm signal when the pulse width of the output pulse from said logic gate means exceeds a predetermined threshold value; and
an output control gate connected to said differential amplifier and said logic gate means, said output control gate opening and closing in accordance with the logical level of the output pulse from said logic gate means.

12. A balanced signal receiving circuit as set forth in claim 11, further comprising:
latch means for receiving an output from said pulse width detecting means and generating the alarm signal, said output control gate receiving the alarm signal from said latch means.

* * * * *

UNITED STATES PATENT AND TRADEMARK OFFICE
CERTIFICATE OF CORRECTION

PATENT NO. : 5,087,832
DATED : FEBRUARY 11, 1992
INVENTOR(S) : HIROSHI MATSUNAGA

It is certified that error appears in the above-identified patent and that said Letters Patent is hereby corrected as shown below:

TITLE PAGE [57] ABSTRACT, line 1, "of" should be deleted.

Col. 1, line 6, "invention balanced" should be --invention relates to a balanced--.

Col. 2, line 25, "nating" should be --nates--;
line 29, "6 is circuit" should be --6 is a circuit--;
line 50, "waveforms" should be --waveform--.

Col. 3, line 33, "100 Ω as" should be --100 Ω is used as--.

Col. 4, line 23, "FIG. 3." should be --FIG. 5,--.

Col. 5, line 33, "of" should be deleted;
line 42, " ⓞ " should be -- ① --.

Col. 6, line 1, "volt" should be --voltage--.

Col. 7, line 23, "the" should be --a--;
line 63, "waveforms" should be --waveform--.

Signed and Sealed this

Fifteenth Day of June, 1993

Attest:

MICHAEL K. KIRK

*Attesting Officer*  *Acting Commissioner of Patents and Trademarks*